United States Patent
Wesselkamper et al.

(10) Patent No.: US 10,288,496 B1
(45) Date of Patent: May 14, 2019

(54) RING OSCILLATOR FOR TEMPERATURE OR VOLTAGE SENSING

(71) Applicant: Xilinx, Inc., San Jose, CA (US)

(72) Inventors: James D. Wesselkamper, Albuquerque, NM (US); Frank C. Wirtz, II, Corrales, NM (US); Giulio Corradi, Munich (DE); Jason J. Moore, Albuquerque, NM (US)

(73) Assignee: XILINX, INC., San Jose, CA (US)

( * ) Notice: Subject to any disclaimer, the term of this patent is extended or adjusted under 35 U.S.C. 154(b) by 243 days.

(21) Appl. No.: 15/236,703

(22) Filed: Aug. 15, 2016

(51) Int. Cl.
  *G01K 1/14* (2006.01)
  *G01K 13/00* (2006.01)
  *G01R 19/25* (2006.01)

(52) U.S. Cl.
  CPC ............ *G01K 13/00* (2013.01); *G01R 19/25* (2013.01)

(58) Field of Classification Search
  USPC ............... 331/57, 176; 374/1, 163, 170–171
  See application file for complete search history.

(56) References Cited

U.S. PATENT DOCUMENTS

| | | | | |
|---|---|---|---|---|
| 7,307,486 B2* | 12/2007 | Pernia | ..................... | H03B 5/04 331/117 FE |
| 7,774,627 B2* | 8/2010 | Gaskins | .................. | G06F 1/206 713/300 |
| 8,130,044 B2* | 3/2012 | Bereza | ..................... | H03L 7/18 331/167 |
| 2006/0071734 A1* | 4/2006 | McCorquodale | ........ | H03B 5/06 331/176 |
| 2012/0307867 A1* | 12/2012 | Chung | ..................... | G01K 7/32 374/170 |

OTHER PUBLICATIONS

Leatherman, Gerald S. et al., "Die-Package Stress Interaction Impact on Transistor Performance," Proc. of the 2012 IEEE Reliability Physics Symposium (IRPS), Apr. 15, 2012, pp. 2E.4.1-2E.4.6, IEEE, Piscataway, New Jersey, USA.

* cited by examiner

*Primary Examiner* — Lisa M Caputo
*Assistant Examiner* — Nasir U. Ahmed
(74) *Attorney, Agent, or Firm* — LeRoy D. Maunu

(57) ABSTRACT

Methods and circuits are disclosed for measuring temperature and/or voltage using ring oscillators. In an example implementation, temperature and/or voltage are determined using an iterative measurements of a ring oscillator. The ring oscillator oscillates with a different voltage-temperature response in each of the first, second and third modes. In each iteration, a first set of indications of frequency are determined for a ring oscillator in a first mode, a second mode, and a third mode. A coarse temperature estimate and a coarse voltage estimate of the ring oscillator are determined based on the indications of frequency measured in a first iteration. A more accurate temperature estimate and a more accurate voltage estimate of the ring oscillator are determined as a function of a second set of indications of frequency measured in a second iteration, the coarse temperature estimate, and the coarse voltage estimate.

20 Claims, 9 Drawing Sheets

US 10,288,496 B1

RING OSCILLATOR FOR TEMPERATURE OR VOLTAGE SENSING

TECHNICAL FIELD

The disclosure generally relates to monitoring temperature and voltage of electronic circuits.

BACKGROUND

Addressing thermal effects in integrated circuits (ICs) is an ongoing challenge. The performance of an IC varies as temperature or voltage changes, and often the resulting variation is undesirable. Moreover, high temperatures or voltages can damage or destroy integrated circuit components.

Some ICs, referred to as programmable IC, include programmable hardware resources (e.g., programmable hardware resources and/or programmable routing resources) that can be programmed to implement various circuits. One type of programmable IC, referred to as a field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay locked loops (DLLs), bus or network interfaces such as Peripheral Component Interconnect Express (PCIe) and Ethernet, and so forth.

Some ICs include enough components and functionality to effectively serve as a computer system on a single IC chip. ICs with such functionality are sometimes referred to as a system on a chip (SOC). An SOC can include one or more processor circuits that execute software instructions in order to carry out different functions and/or include programmable hardware resources that can be programmed to form various circuit designs. Upon startup (e.g., hard-power on or hard reset), the SOC can first execute a boot read only memory (ROM) code that configures the SOC to retrieve and load a boot image. The boot image can specify how peripheral functional blocks of the SOC are configured, configure programmable resources to implement a hardware portion of a system design, setup and run the operating system (OS) to implement a software portion of the system design, and/or perform other boot-related functions. The hardware portion specifies a hardware circuit arrangement included in the system design. The software portion of the system design specifies a set of instructions that are executed by a processor of the SOC during operation of the system.

It should be appreciated that execution of program code within a processor is distinguishable from "programming" or "configuring" the programmable hardware circuitry that may be available on an IC. The act of programming or configuring the programmable circuitry of an IC results in the implementation of different physical circuitry as specified by the configuration data within the programmable circuitry.

SUMMARY

Various implementations are directed to measurement of temperature and/or voltage using multi-mode ring oscillator circuits. In an example implementation, temperature and voltage are estimated using iterative measurements of a ring oscillator. The ring oscillator oscillates with a different voltage-temperature response in each of a first mode, a second mode, and a third mode. In a first iteration, a first set of indications of frequency (e.g., number of oscillations) are measured for a ring oscillator in a first mode, a second mode, and a third mode. The ring oscillator oscillates with a different voltage-temperature response in each of the first, second and third modes. A coarse temperature estimate and a coarse voltage estimate of the ring oscillator are determined based on the indications of frequency measured in the first iteration. In a second iteration, a second set of indications of frequency are measured for the ring oscillator in the first, second, and third modes. A more accurate temperature estimate and a more accurate voltage estimate of the ring oscillator are determined as a function of the indications of frequency measured in the second iteration, the coarse temperature estimate, and the coarse voltage estimate.

In another example implementation, an integrated circuit (IC) includes a ring oscillator configured to oscillate with a different voltage-temperature response in each of a first mode, a second mode, and a third mode. The IC also includes a logic circuit coupled to the ring oscillator and configured to estimate a temperature and/or voltage in an iterative measurement process. In a first iteration, the logic circuit measures a first set of indications of frequency of the ring oscillator in a first mode, a second mode, and a third mode. The logic circuit determines a coarse temperature estimate and a coarse voltage estimate of the ring oscillator based on the indications of frequency measured in the first iteration. In a second iteration, the logic circuit measures a second set of indications of frequency for the ring oscillator in the first, second, and third modes. The logic circuit determines a more accurate temperature estimate and a more accurate voltage estimate of the ring oscillator as a function of the indications of frequency measured in the second iteration, the coarse temperature estimate, and the coarse voltage estimate.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION

Figure 1:
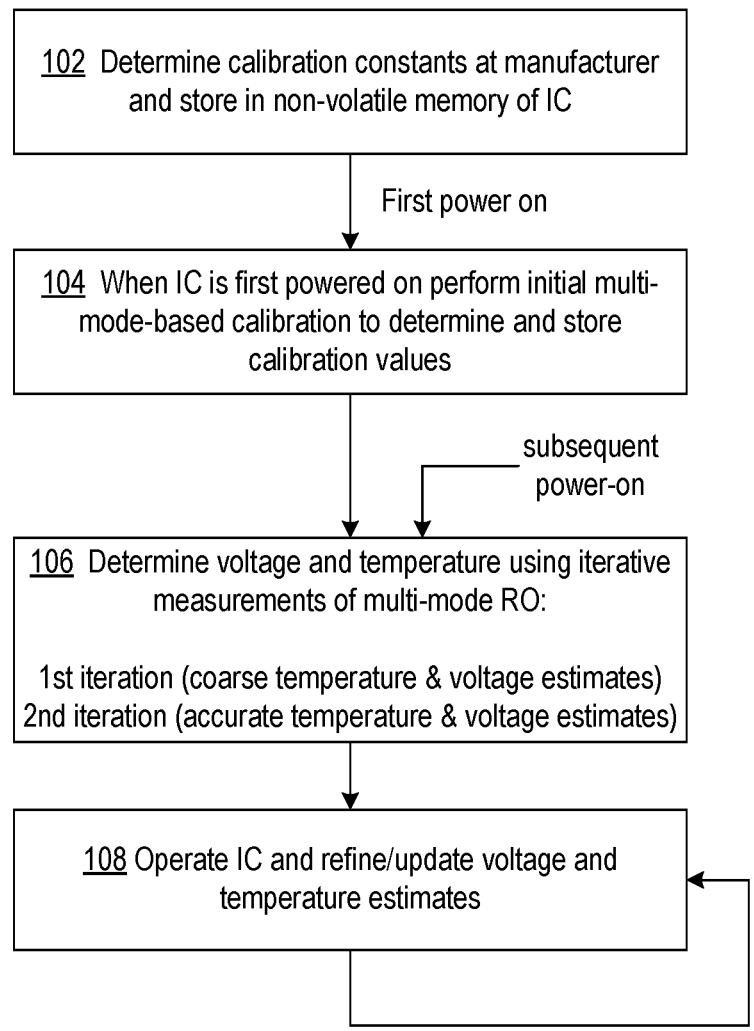
FIG. 1 shows an example process for sensing temperature and/or voltage using multi-mode ring oscillators, consistent with one or more implementations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed to measurement of temperature and/or voltage using multi-mode ring oscillator circuits. As previously indicated, performance of an IC (e.g., switching speed) may vary as temperature or voltage changes. ICs may include a number of dedicated temperature and/or voltage sensors to measure voltages and/or temperatures in the ICs. Voltage and/or clock frequency may be adjusted based on the sensed voltages and/or temperatures to maintain desired performance of circuits on the IC. However, different regions of an IC may exhibit different temperatures and voltages due to differences in circuit layouts and usage. Due to manufacturing costs and/or placement constraints, it may not be feasible to include dedicated temperature and/or voltage sensors in close proximity to many circuits of an IC. As an illustrative example, some custom user circuits implemented in programmable hardware resources of a programmable IC may not be located near a dedicated temperature sensor on the IC. In various example implementations, temperature and voltage are estimated using iterative measurements of a ring oscillator. The ring oscillator may be implemented, for example, in programmable hardware resources of a programmable IC—thereby allowing temperature and/or voltage of circuits implemented within the programmable ICs to be monitored.

In some implementations, the ring oscillator oscillates with a different voltage-temperature response in each of a first mode, a second mode, and a third mode (also referred to as "mode 1," mode 2," and "mode 3"). Oscillation frequency of the ring oscillator in each of the three modes scales linearly with changes in operating voltage. The frequency difference between mode 2 and in mode 3 scales linearly with changes in temperature. In each of multiple iterations, a number of oscillations exhibited by the ring oscillator is measured for each of the three modes. In a first iteration, a coarse temperature estimate and a coarse voltage estimate of the ring oscillator are determined based on the numbers of oscillations exhibited by the ring oscillator for each of the three modes. In subsequent iterations, more accurate temperature and voltage estimates may be determined based on the numbers of oscillations exhibited by the ring oscillator for the first, second, and third modes of the current iteration and temperature and voltage estimates determined for the previous iteration.

Turning now to the figures, FIG. 1 shows an example process for sensing temperature and/or voltage using multi-mode ring oscillators, consistent with one or more implementations. At block 102, calibration constants are determined (e.g., by a manufacturer) and stored in a non-volatile memory of the IC. As described in more detail below, the calibration constants may characterize constants of the temperature-voltage response common to an entire batch of the IC produced by the manufacture When the IC is first powered on, an initial multi-mode calibration is performed to determine and store a set of calibration values. The calibration values characterize various aspects of the temperature-voltage response that may differ for different ICs of the same batch or for different ring oscillators on the same IC. Iterative temperature voltage measurements are performed using the multi-mode ring oscillator, at block 106, following the initial multi-mode calibration and also in response to subsequent power on of the IC. In a first iteration, a coarse temperature and voltage estimate is determined. In a second iteration, a more accurate temperature and voltage estimate is determined. At block 108, voltage and/or temperature estimates may be further in subsequent iterations during operation of the IC.

Figure 2:
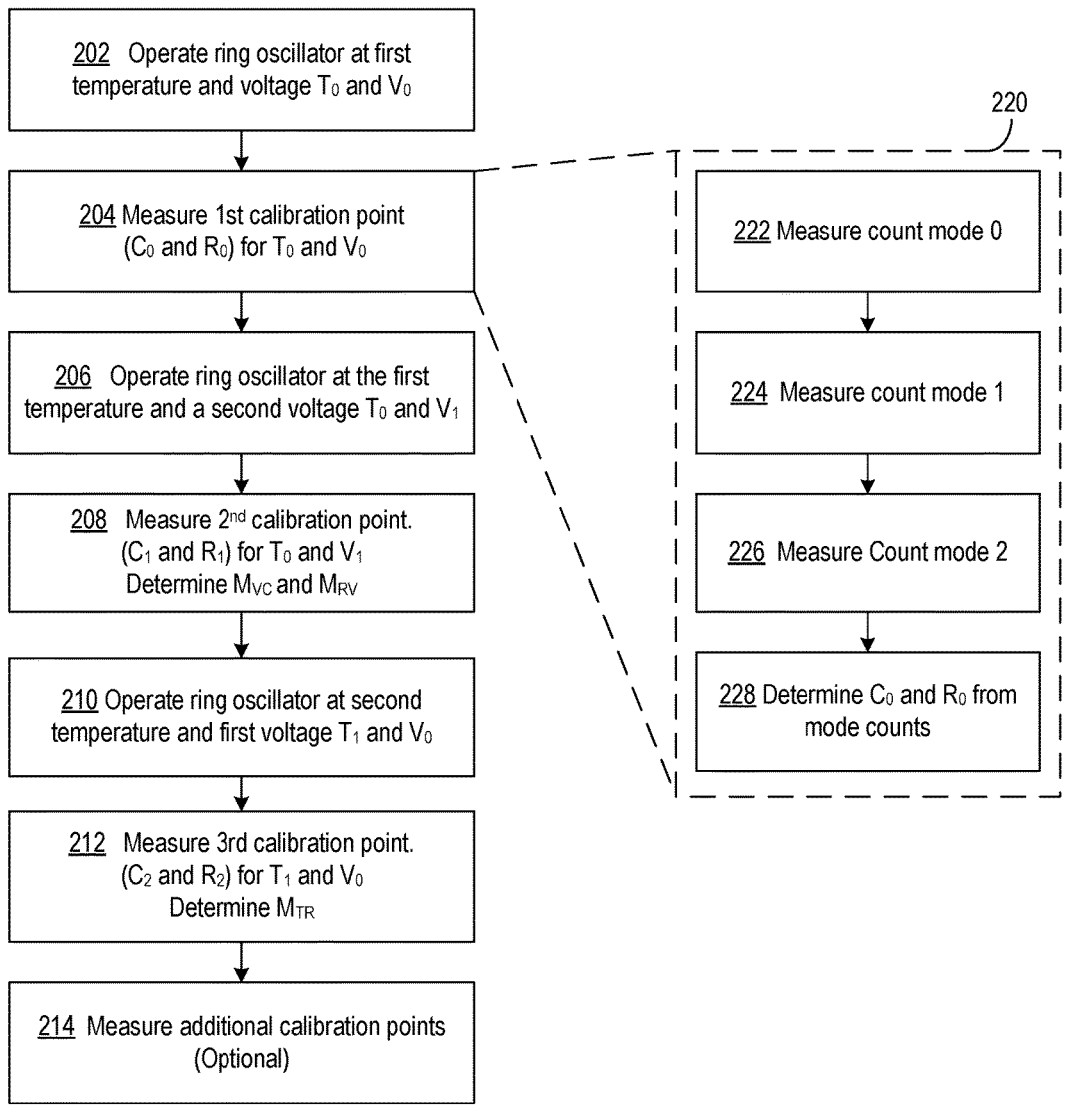
FIG. 2 shows an example process for initial multi-mode based calibration of the sensors, consistent with one or more implementations.

FIG. 2 shows an example process for initial multi-mode based calibration of the sensors, consistent with one or more implementations. The process may be used, for example, to perform the initial calibration at block 104. At block 202, a ring oscillator is operated at a first temperature $T_0$ and first voltage $V_0$. The ring oscillator oscillates with a different voltage-temperature response in each of three modes (e.g., "mode 1," mode 2," and "mode 3"). As described in more detail with reference to FIG. 3, the voltage-temperature response of the ring oscillator may be adjusted in each mode by changing the circuit components included in a circular signal path of the ring oscillator.

At block 204, measurements are taken at a first in time using a first temperature-voltage combination. For ease of reference, the time at which measurements are taken for a particular temperature-voltage combination may be referred to as a first calibration point. Block 220 shows an example process for measuring values for a calibration point. At block 222, the ring oscillator is operated in mode 1 for a measurement period and oscillations of the ring oscillator are counted. In some implementations, oscillations of an oscillating signal generated by the ring oscillator may be counted directly. In some other implementations, frequency of the oscillating signal may be divided prior to counting oscillations.

At block 224, the ring oscillator is operated in mode 2 for the measurement period, and oscillations of the ring oscillator are counted. At block 226, the ring oscillator is operated in a mode 3 for the measurement period and oscillations of the ring oscillator are counted. At block 228, calibration point values "C" and "R" are determined from the three mode counts. C is the counted number of oscillations when operating the ring oscillator in mode 1. R is a ratio of the counted number of oscillations when operating the ring oscillator in mode 1 to the ratio of the counted number of oscillations when operating the ring oscillator in mode 2. For ease of reference, the C and R values determined for a calibration point at block 228 may be referred as a set of calibration point values. For ease of reference, C and R values for a particular calibration point may identified using a sub-numeral following C and R (e.g., $C_0$ and $R_0$ for the first calibration point).

At block 206, the ring oscillator is operated at the first temperature $T_0$ and a second voltage $V_1$. At block 208, values are measured for a second calibration point, for example, using the process shown in block 220. Also at block 208, a slope ($M_{RV}$) is determined for a change in the ratio over a change in the calibration voltage. A slope ($M_{VC}$)

is also detected for a change in the calibration voltage to a change in the determined indication of frequency for the ring oscillator in the first mode.

At block 210, the ring oscillator is operated at a second temperature $T_1$ and the first voltage $V_0$. Temperature may be adjusted using, for example, a heating/cooler element, operating circuits at a higher voltage or higher clock frequency for a period of time. At block 212, values are measured for a third calibration point, for example, using the process shown in block 220. Also at block 212, a slope ($M_{TR}$) is determined for a change in the calibration temperature over a change in the ratio. Optionally, values may be measured for additional calibration points at block 214. As described in more detail in the following, additional calibration points may be useful, for example, to improve accuracy at high operating temperatures. In some implementations, the calibration values $M_{VC}$, $M_{RV}$, $M_{TR}$, $C_0$, $R_0$, $T_0$, and $V_0$ may be stored in a non-volatile memory for use after an IC is power cycled.

Following calibration, the temperature and/or voltage may be estimated using the $M_{VC}$, $M_{RV}$, $M_{TR}$, $C_0$, $R_0$, $T_0$, and $V_0$ values along with one or more sets of C and R values determined after calibration. For ease of reference, the sets C and R values determined at points in time after calibration may be referred as measurement point values. The measurement point values may be determined in the same manner as the calibration point values as described with reference to block 220.

In some implementations, a coarse temperature estimate and coarse voltage estimate may be determined from a first set of measurement point values $C_s$, and $R_s$. The coarse temperature $T_{coarse}$ is specified by the equation $$T_{coarse}=M_{TR}[R_s-R_0]+T_0.$$

The coarse voltage $V_{coarse}$ is specified by the equation $V_{coarse}=M_{VC}[C_s-C_0]+V_0$. More accurate temperature and voltage estimates may be determined using additional sets of measurement point values. For each additional set of measurement point values $C_i$ and $R_i$, a more accurate temperature $T_i$ is specified by the equation $$T_i=M_{TR}[R_i-M_{RV}(V_{i-1}-V_0)-R_0]+T_0.$$

For each additional set of measurement point values $C_i$ and $R_i$, a more accurate voltage $V_i$ is specified by the equation $$V_i=M_{VC}[C_i-(M_{CT}+M_{CT,V}-b_{CT,V}))(T_{i-1}-T_0)-C_0]+V_0,$$

where $M_{CT}$, $M_{CT,V}$, and $b_{CT,V}$ are constants predetermined based on evaluation of the device. The calibration constants may be determined, for example, by a manufacturer and stored in a non-volatile memory of the device. $M_{CT}$ is a slope of mode 0 oscillation count to temperature. $M_{CT,V}$ is a slope of $M_{CT}$ to voltage. $B_{CT,V}$ is a voltage at which $M_{CT}$ is equal to a reference value (e.g., 218000).

Temperature and voltage estimates may be determined over several iterations with new measurement points to progressively improve accuracy of the temperature and voltage estimates. Different applications may utilize different numbers of iterations in order to determine temperature and voltage measurements within the tolerance requirements of the application. It has been observed that 8 iterations should be sufficient to determine make an accurate determination of temperature and/or voltage for many applications.

In some applications, voltage and temperature response of the oscillators may become non-linear at high temperatures (e.g., exceeding 90° C.). The non-linearity has the effect of producing a temperature and voltage error that increases with temperature above a given point. The slope of the error and the temperature at which the error occurs is approximately the same for all ROs on a given device, but varies from one device to the next. For ease of reference, the error induced by non-linearity at high temperatures may be referred to as runaway error.

In some implementations, temperature and/or voltage estimates may be adjusted to reduce the runaway error. The non-linearity exhibited on a particular device is determined during calibration by measuring additional calibration point values at block 214. $T_{Runaway}$, $M_{TRunaway}$, and $M_{VRunaway}$ and are calculated for the device based on the additional calibration point values. $T_{Runaway}$ is the temperature at which the temperature-voltage response of the oscillator begins to become non-linear. $M_{TRunaway}$ is a slope of change in temperature runaway error to change in temperature. $M_{VRunaway}$ is a slope of change in voltage runaway error to change in temperature. During operation if the temperature is over $T_{runaway}$ then an additional adjustment $\varepsilon_T$ and/or $\varepsilon_V$ is made based on the following two equations $$\varepsilon_T=M_{TRunaway}*(T-T_{Runaway}); \text{ and}$$

$$\varepsilon_V=M_{VRunaway}*(T-T_{Runaway})$$

It is recognized that environmental conditions may vary over time and introduce error in the relative count values sequentially measured in the three different modes. In some implementations, environmental error may be reduced by respectively aggregating multiple count values. For example, in some implementations, oscillations in each mode may be sequentially counted multiple times for each calibration/measurement point. The count values for each mode may be added together to produce a respective aggregate count value. The aggregate count values may be used to determine the C and R values for the calibration/measurement point, as described with reference to FIG. 2. By measuring each mode in succession multiple times, variation in environment conditions can be evened out such that the sum of mode 1 measurements will be performed under similar environmental conditions as those for the sum of mode 2 measurements and the sum of mode 3 measurements.

As another example, some implementations may include a reference ring oscillator operated in the same mode in each measurement period. Environmental variation is indicated by changes between successive oscillator counts of the reference oscillator. In some implementations, the oscillation count values of the reference oscillator are used to scale oscillation count values used for determining temperature and/or voltage estimates. As an illustrative example, if the reference ring oscillator are mode 1, mode 2, and mode 3 oscillation counts of for the 90,000, 89,000, 89,000, it can be determined that system noise caused the mode 1 measurement to be 1.12% faster. Accordingly, the mode 1 count from the same measurement period that is used to determine voltage and/or temperature measurement may be scaled down by 1.12% to mitigate the impact of the environmental noise. In this manner, effects due to any variation in environmental conditions can be reduced.

Figure 3:
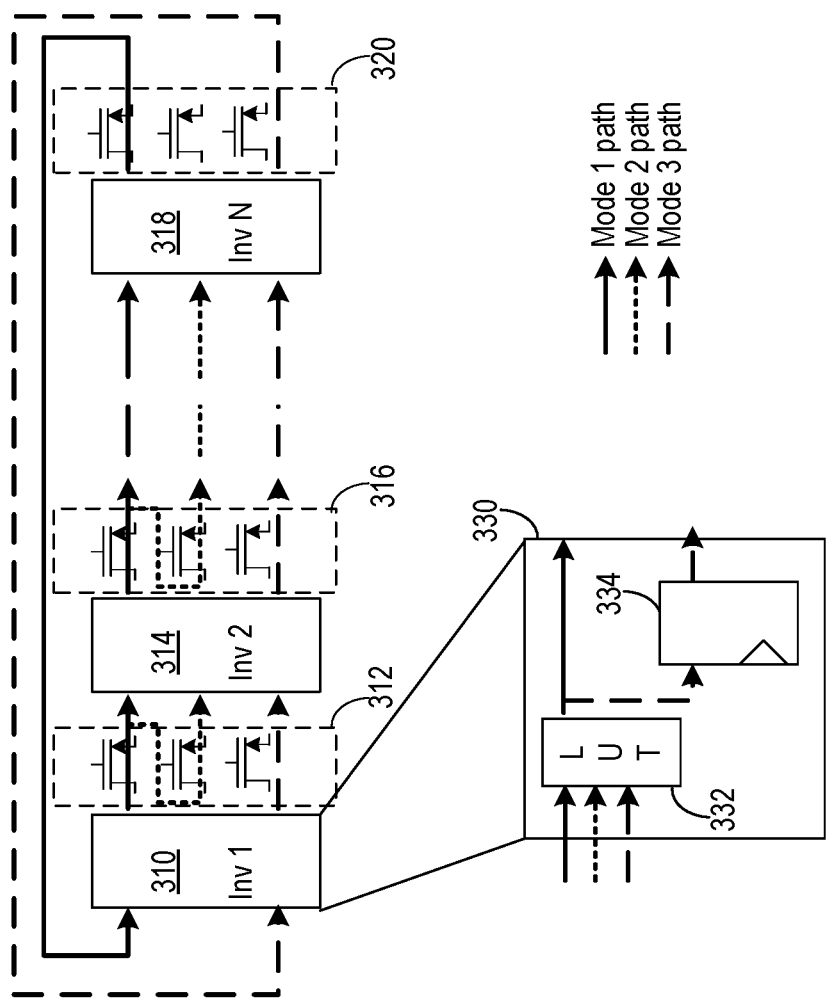
FIG. 3 shows a block diagram of a multi-mode ring oscillators, consistent with one or more implementations.

Multi-mode ring oscillators may be implemented using various circuit arrangements in different implementations. FIG. 3 shows a block diagram of an example multi-mode ring oscillator, consistent with one or more implementations. The multi-mode ring oscillator includes a plurality of inverting circuits 310, 314, and 318 connected in a circular signal path by routing circuits 312, 316, and 320. Circuit 330 shows an example circuit that may be used to implement the inverting circuits 310, 314, and 318 in some implementations. The circuit 330 includes look-up-table (LUT) 332 configured to operate as an inverter and a transparent latch 334 having an input coupled to an output of the LUT 332.

In a first mode (mode 1), output of the LUT 332 of each inverting circuit 310, 314, and 318 is provided to the input of the next inverting circuit via the mode 1 path depicted as a solid line in FIG. 3. In a second mode (mode 2), output of the LUT 332 of each inverting circuit 310, 314, and 318 is provided to the input of the next inverting circuit via the mode 2 path depicted as a small dashed line in FIG. 3. The mode 2 path has a longer routing delay in comparison to the mode 1 path. In a third mode (mode 3), output of the LUT 332 of each inverting circuit 310, 314, and 318 is provided to the input of the next inverting circuit via a longer the mode 2 path depicted as a large dashed line in FIG. 3.

Figure 4:
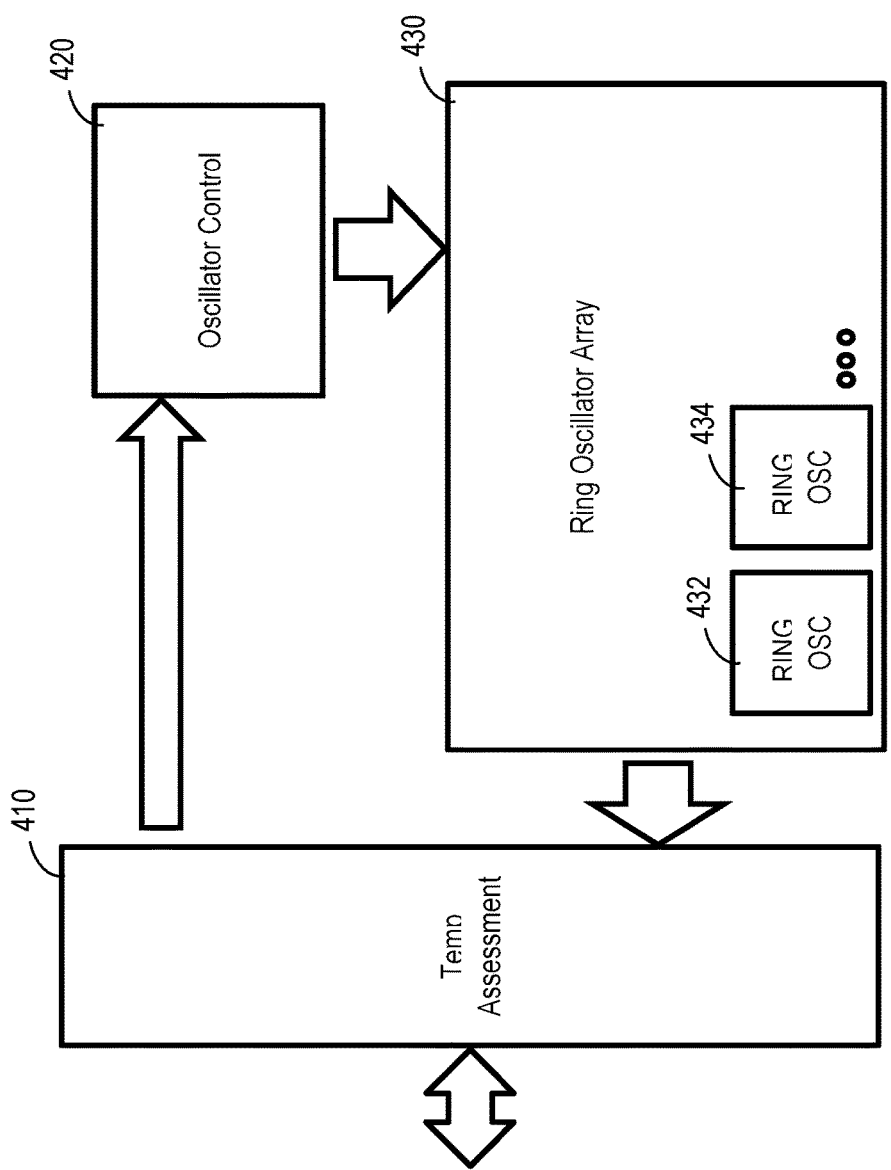
FIG. 4 shows a block diagram of an example system configured to monitor temperature using multi-mode ring oscillators, consistent with one or more implementations.

FIG. 4 shows a block diagram of an example system configured to monitor temperature using multi-mode ring oscillators, consistent with one or more implementations. In this example, the system includes an array 430 of multi-mode ring oscillators 432 and 434. Each of the multi-mode ring oscillators 432 and 434 is configured to oscillate with a different voltage-temperature response in each of a first mode, a second mode, and a third mode.

An oscillator control circuit 420 is configured to control the mode of operation of the multi-mode ring oscillators 432 and 434 to facilitate measurement of oscillation in each of the three modes in response to a temperature sensing circuit initiating measurement of a new calibration/measurement point. As described in more detail with reference to the process in FIG. 5, the oscillator control circuit 420 may cause the oscillators to sequentially oscillate in each of the three modes for a designated measurement period of time.

A temperature assessment circuit 410 is configured to prompt oscillation control circuit 420 to sequentially operate the ring oscillators 432 and 434 in each of the three modes for a plurality of calibration/measurement points facilitate calibration of the ring oscillators and determination temperature and/or voltage estimates as described with reference to FIGS. 1 and 2.

For each calibration/measurement point x, the temperature assessment circuit 410 sets a control signal to prompt the oscillation control circuit 420 to sequentially operate the ring oscillators 432 and 434 in each of the three modes for the measurement period. In temperature assessment circuit 410 counts oscillations of the ring oscillators in the respective measurement period and determine a respective set of calibration/measurement point values ($C_x$ and $R_x$) for each of the ring oscillators 432 and 434. In some implementations, the temperature assessment circuit 410 may count oscillations of an oscillating signal generated by a ring oscillator. In some other implementations, the temperature assessment circuit 410 may divide frequency of the oscillating signal generated by a ring oscillator and count oscillations in the frequency divided signal.

Alternatively or additionally, in some implementations, oscillations may be counted by counter circuits (not shown) respectively connected to ring oscillators in the array 430. Counted values may be provided to the temperature assessment circuit 410 by the counter circuits after counting oscillations for each of the different modes. In some implementations, the counter circuits may be connected together in a read chain. Once the oscillations have been counted for each mode, count values may be shifted through the read chain and sequentially communicated to the temperature assessment circuit 410.

For each calibration/measurement point x, the temperature assessment circuit 410, a respective set of $C_x$ and $R_x$. Using the $C_x$ and $R_x$ values determined from multiple calibration/measurement points, the temperature assessment circuit 410 determines calibration values and/or determine temperature and/or voltage estimates as described with reference to FIGS. 1 and 2.

Alternatively or additionally, the temperature assessment circuit 410 may include a communication interface (e.g., an AXI interface). The temperature assessment circuit 410 may communicate data values to a communicatively connected circuit (e.g., a CPU processor) configured to perform one or more of the above described processes. As an illustrative example, the temperature assessment circuit 410 may be configured to determine and provide $C_x$ and $R_x$ values for each calibration/measurement point to a processing circuit configured to perform the determination of the voltage and/or temperature estimates.

Figure 5:
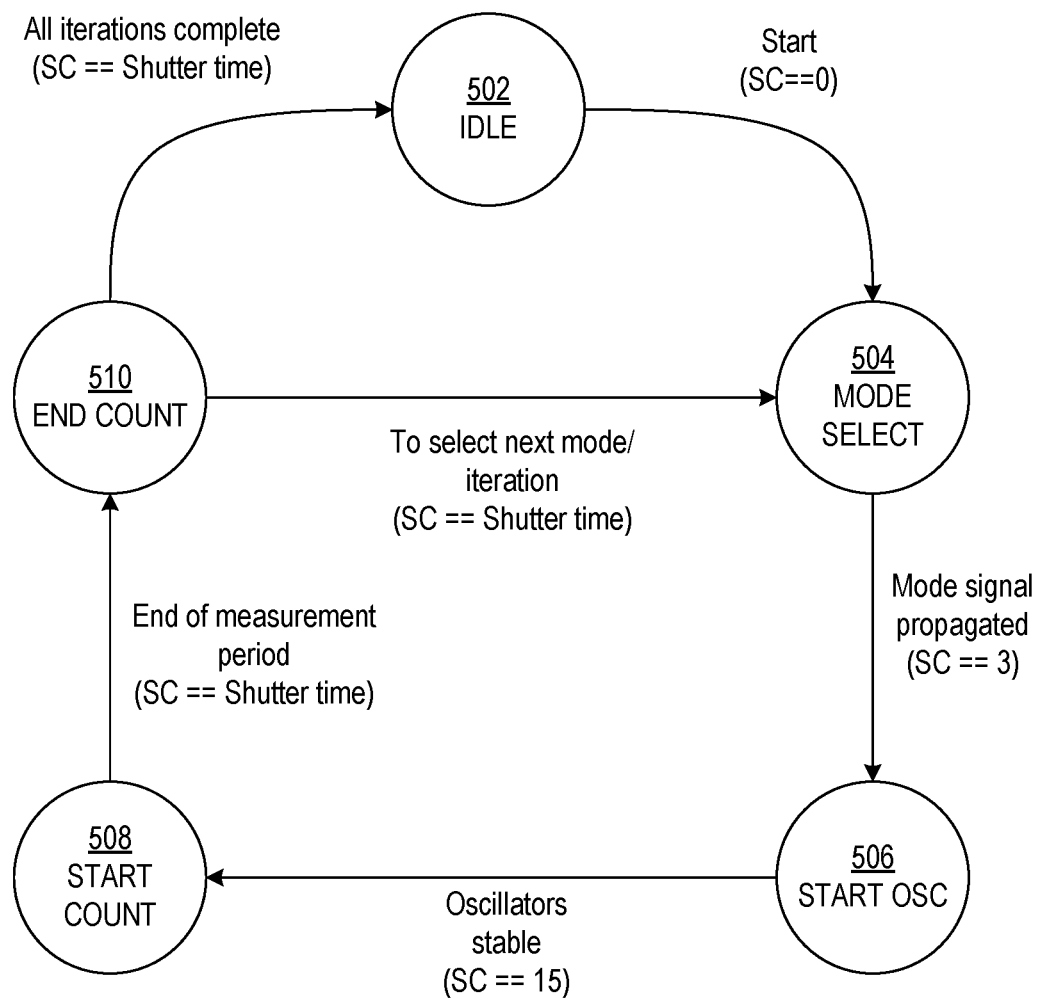
FIG. 5 shows an example process for operating a multi-mode ring oscillator in multiple modes, consistent with one or more implementations.

FIG. 5 shows an example process for operating a multi-mode ring oscillator in multiple modes, consistent with one or more implementations. The process may be performed, for example, by shutter control circuit 420 in FIG. 4. In state 502, the ring oscillator is idle. At start of a calibration point measurement, the process transitions to state 504. At state 504, mode for the ring oscillator is determined and a mode selection signal is provided to the ring oscillator to place the ring oscillator in the selected mode. After waiting a short period to allow the selection signal to propagate, the process transitions to state 506. At state 506, the ring oscillator is operated for a start-up period of time to allow oscillation to start and stabilize. Following the start-up period, the process transitions to state 508. In state 508, cycles of the ring oscillator are counted for a measurement period. At the end of the measurement period, the process transitions to state 510. At state 510, the count for the selected mode is stored. If all modes have not been selected, the process transitions back to state 504, where the next mode is selected. Otherwise, if all modes have been selected, the process transitions back to idle state 502.

The example implementations may be applied to measure temperature and/or voltage in various applications. The implementations are thought to be particularly applicable to monitoring temperature and/or voltage of circuitry implemented within programmable hardware resources of a programmable IC or system on chip. One or more ring oscillators can be implemented at various locations within the programmable hardware resources. Accordingly, temperature/voltage sensors implemented closer in proximity to circuits of a circuit design that are also implemented in programmable hardware resources. By implementing sensors closure in proximity, dangerous temperature spikes can be detected earlier and circuits can be powered down more quickly—thereby mitigating damage to other circuits.

In some mission-critical applications, a programmable IC may use redundant hard-wired circuits to perform a specific mission-critical function. The redundant circuits provide a mechanism to ensure that operation of the mission-critical function continues when an error is encountered in one of the redundant circuits. Because mission-critical functions can vary greatly for different systems and applications, hard-wired redundant circuits may not be suitable in all systems, such as those implemented in programmable ICs.

In some implementations, a programmable IC is configured to operate a software implementation of a user design using a processing sub-system of the programmable IC and operate a redundant hardware implementation in a programmable logic sub-system of the programmable IC. The programmable logic sub-system and the processing sub-system are independently powered in separate power domains. If either of the sub-system become subject to unrecoverable error, the other sub-system can continue operation to provide uninterrupted service.

Figure 6:
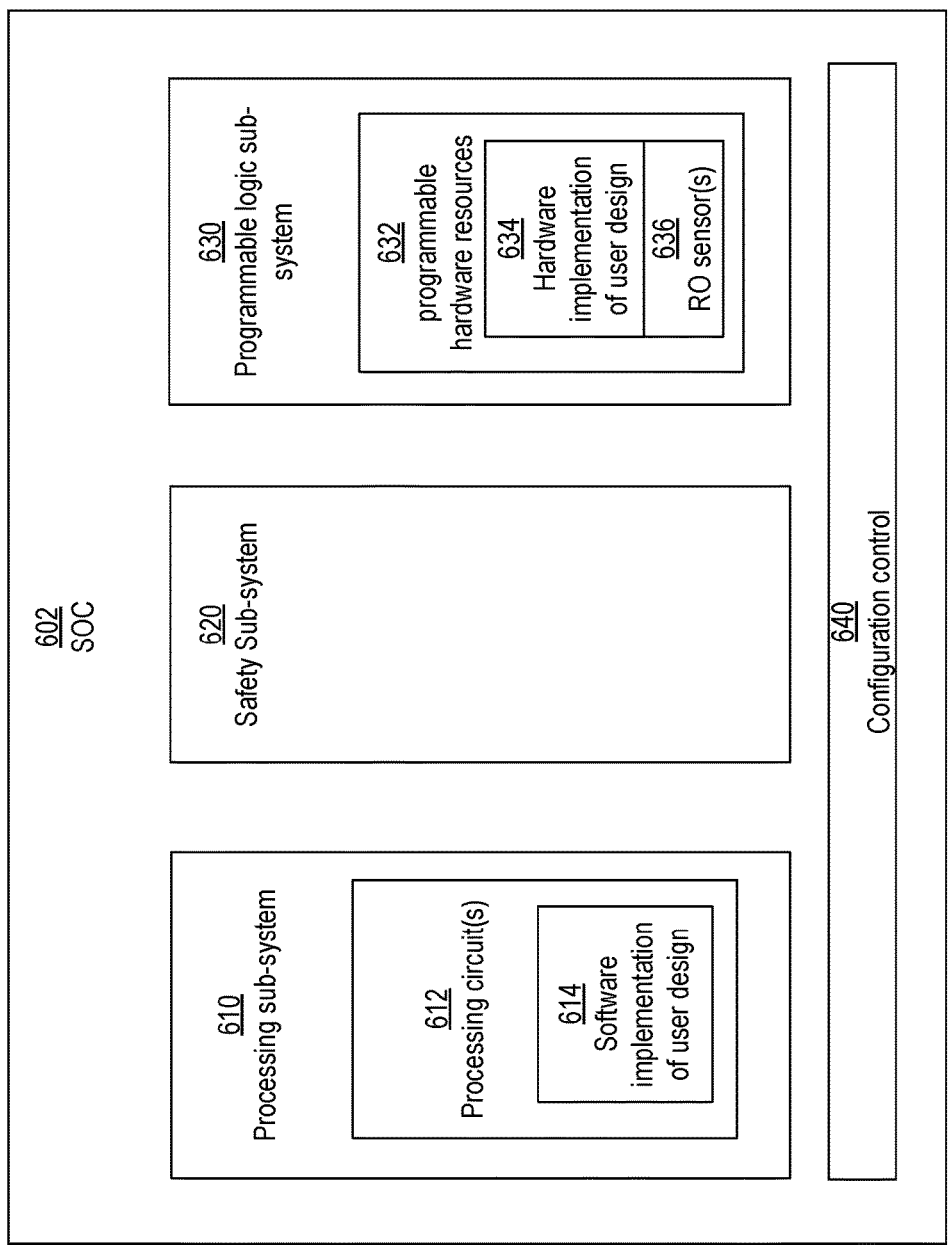
FIG. 6 shows an example system on chip that may be configured to monitor temperature using multi-mode ring oscillators, consistent with one or more implementations.

FIG. 6 shows an example system on chip that may be configured to monitor temperature using multi-mode ring oscillators, consistent with one or more implementations. The system on chip 602 includes a processing sub-system 610, a safety sub-system 620, and a programmable logic sub-system 630. The programmable logic sub-system 630 includes a plurality of programmable hardware resources 632. The processing sub-system 610 includes one or more processing circuits 612 configured to execute program code.

Upon startup (e.g., hard-power on or hard reset), a configuration control circuit 640 programs the processing sub-system 610 and/or the programmable logic sub-system to implement a system design specified by a set of configuration data (e.g., include in a retrieved/received boot image). The configuration control circuit 640 programs the programmable hardware resources to form circuitry of a hardware implementation of a user design 634 indicated in the set of configuration data. The configuration control circuit 640 may also configure processing circuits of the processing sub-system 610 to execute program code of a software implementation of the system design 614 included in the set of configuration data after programming the programmable hardware resources.

The programmable logic sub-system and the processing sub-system are independently powered in separate power domains. By operating the hardware and software implementations in respective sub-systems that are independently powered, power failure in either of the processing or programmable logic sub-systems can be isolated from the other sub-system—thereby ensuring that one of the hardware or software implementations of the user design remains in operation.

In this example, the programmable hardware resources 632 are also configured to implement one or more multi-mode ring oscillation sensors 636, consistent with various implementations. The safety sub-system 620 may be configured to control operation of the ring oscillation sensors 636 as described with reference to shutter control circuit 420 in FIG. 4, and determine temperature and/or voltage as described with reference to FIGS. 1 and 2 and control circuit 410 in FIG. 4.

In some implementations, the safety subsystem 620 is configured to power down, reset, and/or adjust voltage of the programmable logic sub-system 630 in response to temperature and/or voltage determined using the multi-mode ring oscillators 636. For example, in response to the determined voltage and/or temperature indicating catastrophic failure in the programmable logic sub-system 630 the safety subsystem 620 may power down the programmable logic sub-system 630 without affecting operating of the processing sub-system. In some implementations, the safety sub-system may also be configured to perform various other actions to and/or mitigate errors responsive to the determined voltage and/or temperature including for example, error signal generation, data backup, switch to redundant/backup system, and/or built-in-self test.

Figure 7:
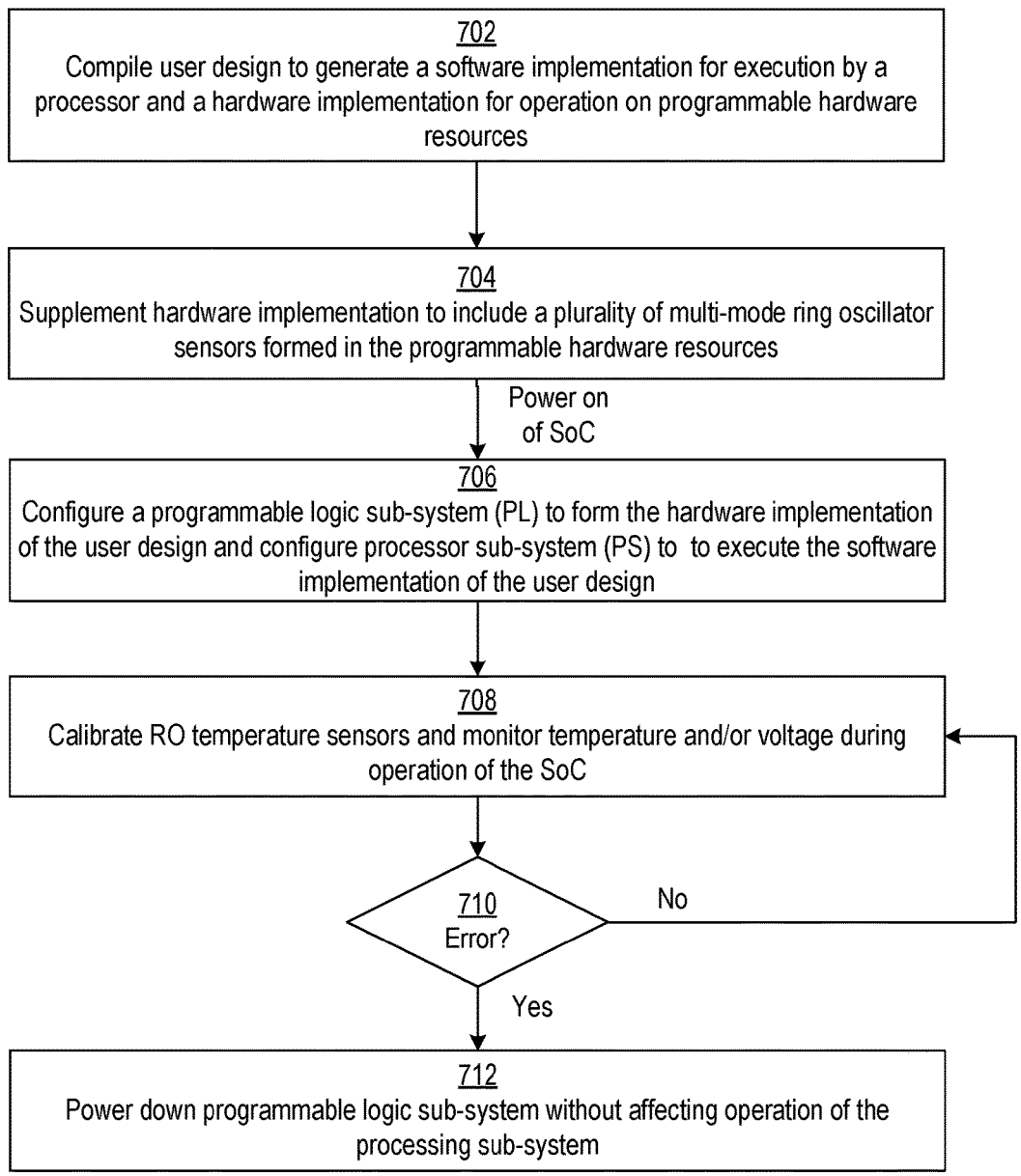
FIG. 7 shows example process for configuring a programmable IC to implement a user design and monitor temperature using multi-mode ring oscillators, consistent with one or more implementations.

FIG. 7 shows example process for configuring a system on chip to implement a user design and monitor temperature using multi-mode ring oscillators, consistent with one or more implementations. At block 702, a user design is compiled to generate a software implementation for execution by a processor and a hardware implementation for operation on the programmable hardware resources. At block 704, the hardware implementation is supplemented to include a plurality of multi-mode ring oscillator sensors formed in the programmable hardware resources. When a system on chip is powered on, a programmable logic sub-system is configured at block 706 to form the hardware implementation of the user design and configure a processor sub-system to execute the software implementation of the user design. At block 708, multi-mode ring oscillator sensors are calibrated and used to monitor temperature and/or voltage during operation of the system on chip. If temperature or voltage are indicative of error, the process proceeds from decision block 710 to block 712, where the programmable logic sub-system is powered down without affecting operation of the processing sub-system.

Figure 8:
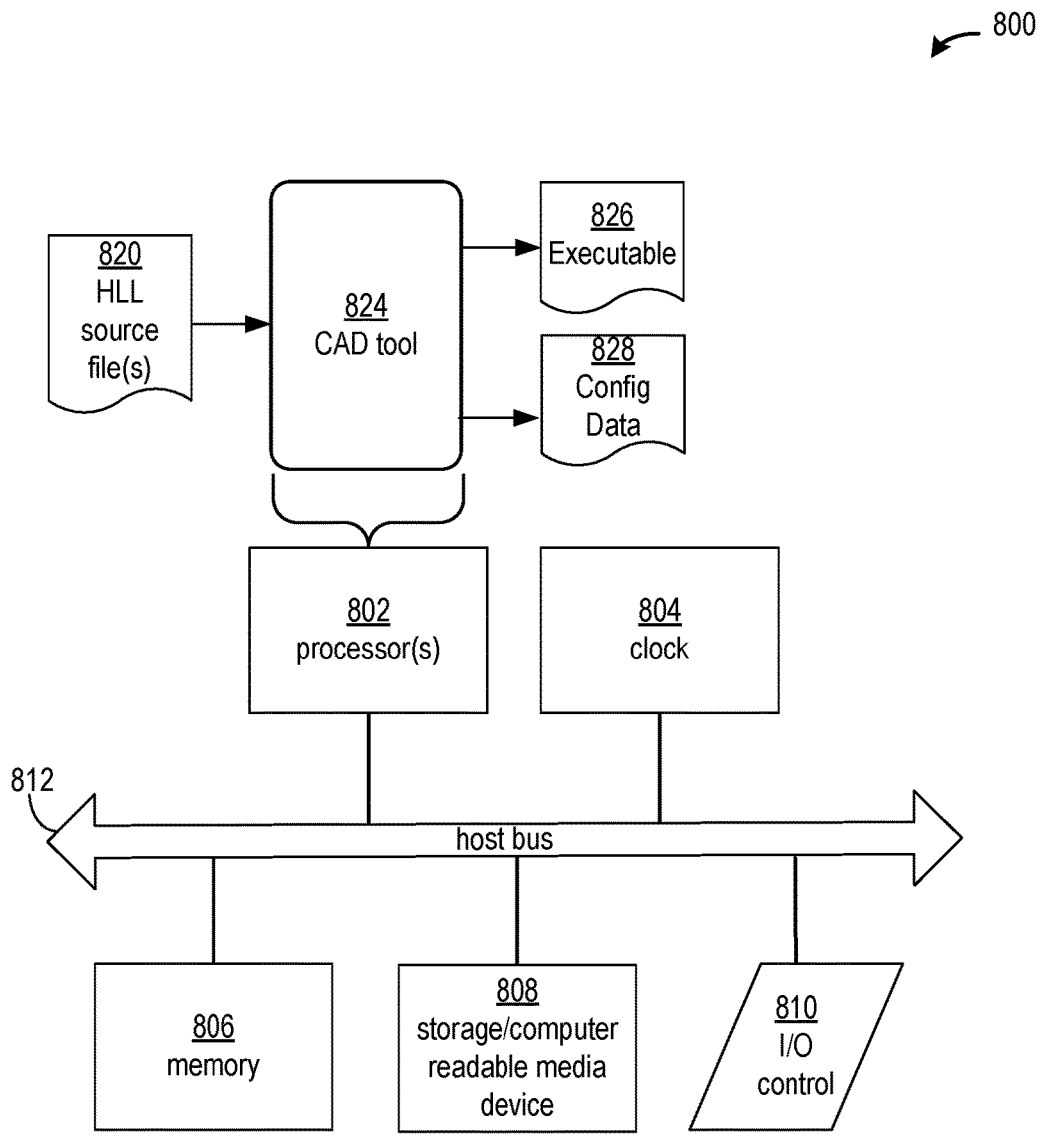
FIG. 8 shows example computing system that may be used to configure a programmable IC to implement a user design and monitor temperature using multi-mode ring oscillators, consistent with one or more implementations.

FIG. 8 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory arrangement 806, and an input/output control unit 810, all coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 802 may be one or more general purpose processors, or a combination of one or more general purpose processors and suitable co-processors, or one or more specialized processors (e.g., RISC, CISC, pipelined, etc.). The memory arrangement 806 typically includes multiple levels of cache memory, and a main memory. The memory arrangement 806 may include local and/or remote persistent storage, such as provided by magnetic disks (not shown), flash, EPROM, or other non-volatile data storage. The memory arrangement 806 may be read or read/write capable.

The processor(s) 802 executes the software in the memory arrangement 806, reads data from and stores data to the memory arrangement 806, and communicates with external devices through the input/output control arrangement 810. These functions are synchronized by the clock signal generator 804. The resources of the computing arrangement may be managed by either an operating system (not shown), or a hardware control unit (not shown).

In some implementations, the memory arrangement 806 stores a set of instructions that, when executed, cause the processor 802 to provide a CAD tool 824. The CAD tool 824 may provide a GUI configured to aid in the design, simulation and/or testing of system designs. In some implementations, the CAD tool 824 may be configured to automatically compile an HLL source file 820 for implementation of a system design on a SOC (e.g., 602 in FIG. 6).

The CAD tool 824 may be configured to identify and determine subsets of function calls to hardware accelerated functions for implementation in programmable logic resources of the SOC. The CAD tool 824 generates or retrieves hardware description language (HDL) code describing circuits for implementation of the hardware accelerated functions. The CAD tool 824 also generates or retrieves HDL code to implement one or more multi-mode ring oscillators and/or a control circuit configured to determine temperature and/or voltage as previously described. The CAD tool 824 generates sets of programmable logic (PL) configuration data 828 for implementation of the circuits described by the generated/retrieved HDL code. The CAD tool 824 may also supplement the HLL source file 820 with HLL code (e.g., interface code) to communicate data between HLL function calls and hardware accelerated functions implemented by the PL configuration data 828 The CAD tool compiles the supplemented HLL source file to produce an executable program 826 configured for execution on a processor of a SOC. The CAD tool 824 may package the executable 826 and PL configuration data 828 into one or more boot images 830 for booting of the SOC.

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Figure 9:
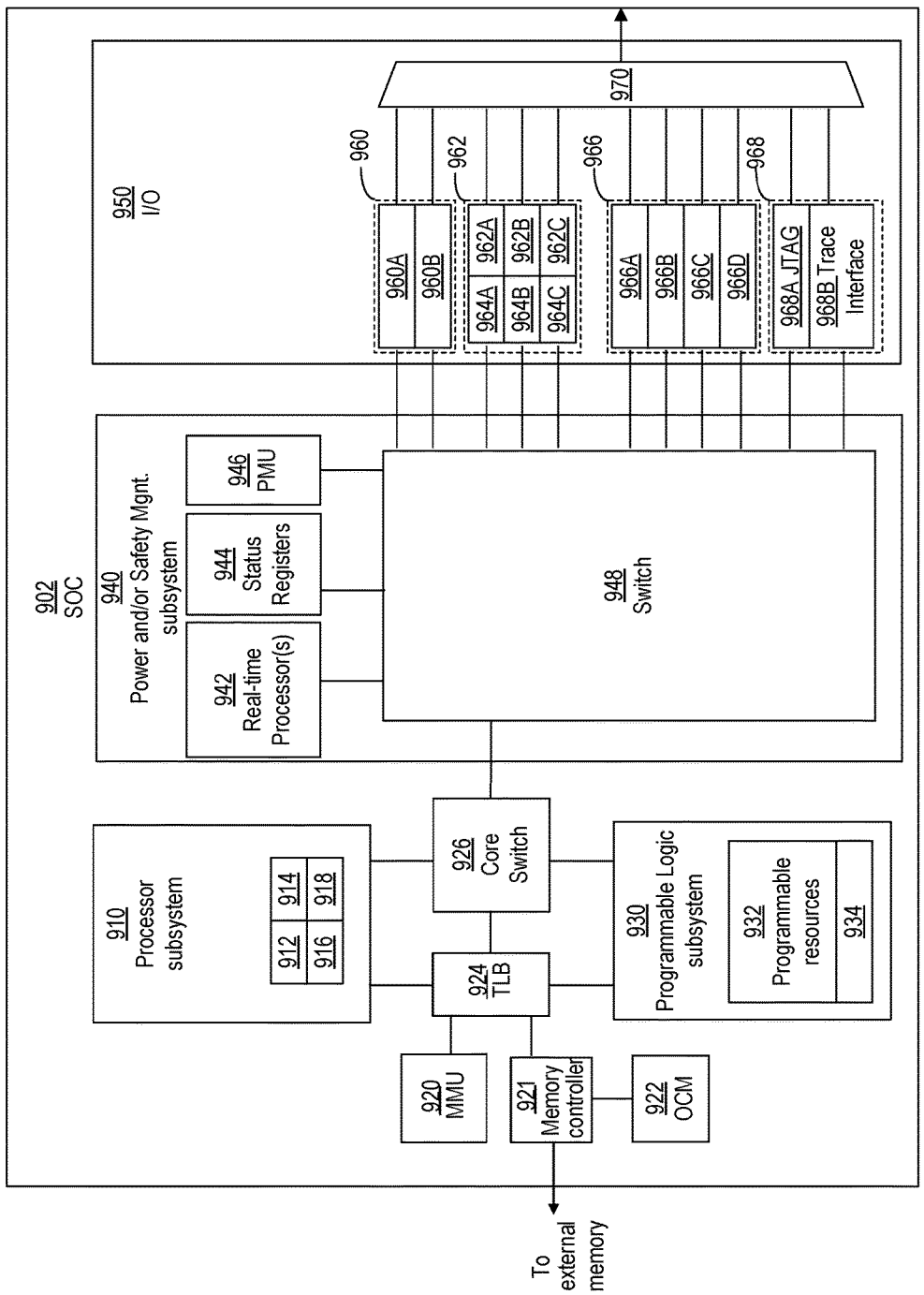
FIG. 9 shows an example system on chip that may be configured to monitor temperature using multi-mode ring oscillators, consistent with one or more implementations.

FIG. 9 shows an example SOC that may be configured using the disclosed processes. The SOC includes a processor sub-system 910 and a programmable logic sub-system 930. In this example, the SOC also includes a sub-system 940 having various circuits for power and/or safety management and an input/output (I/O) sub-system 950 for communication of data with external circuits. The subsystems 910, 930, 940, and 950 may be formed using a plurality of semiconductor dies, and interconnected in an IC package as described in the above examples.

The processing sub-system 910 may be programmed to implement a software portion of the circuit design, via execution of a user program. Alternatively or additionally, the program may implement one or more traffic generators configured to generate data signals to one or more ports of a partial circuit design implemented in programmable resources 932. The program may be specified as part of a configuration data stream or may be retrieved from an on-chip or off-chip data storage device. The processing sub-system 910 may include various circuits 912, 914, 916, and 918 for executing one or more software programs. The circuits 912, 914, 916, and 918 may include, for example, one or more processor cores, floating point units (FPUs), an interrupt processing unit, on chip-memory, memory caches, and/or cache coherent interconnect.

The programmable logic sub-system 930 of the SOC 902 may be programmed to implement a partial circuit design and traffic generation circuits as previously discussed. For instance, the programmable logic sub-system may include a number of programmable resources 932, which may be programmed to implement a set of circuits specified in a configuration data stream. The programmable resources 932 include programmable interconnect circuits, programmable hardware resources, and configuration memory cells. The programmable logic implements the logic of a circuit design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 932 may be programmed by loading a configuration data stream into the configuration memory cells, which define how the programmable interconnect circuits and programmable hardware resources are configured. The collective states of the individual memory cells then determine the function of the programmable resources 932. The configuration data can be read from memory (e.g., from an external PROM) or written into the SOC 902 by an external device. In some implementations, configuration data may be loaded into configuration memory cells by a configuration controller 934 included in the programmable logic sub-system 930. In some other implementations, the configuration data may be loaded into the configuration memory cells by a start-up process executed by the processor sub-system 910.

The SOC 902 may include various circuits to interconnect the processing sub-system 910 with circuitry implemented within the programmable logic sub-system 930. In this example, the SOC 902 includes a core switch 926 that can route data signals between various data ports of the processing sub-system 910 and the programmable logic sub-system 930. The core switch 926 may also route data signals between either of the programmable logic or processing sub-systems 910 and 930 and various other circuits of the SOC, such as an internal data bus. Alternatively or additionally, the processing sub-system 910 may include an interface to directly connect with the programmable logic sub-system—bypassing the core switch 926. Such an interface may be implemented, for example, using the AMBA AXI Protocol Specification (AXI) as published by ARM.

In some implementations, the processing sub-system 910 and the programmable logic sub-system 930 may also read or write to memory locations of an on-chip memory 922 or off-chip memory (not shown) via memory controller 921. The memory controller 921 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 921 is able to communicate is provided for purposes of illustration only and is not intended as a limitation or to be exhaustive. As shown in FIG. 9, the SOC 902 may include a memory management unit 920 and translation look-aside buffer 924 to translate virtual memory addresses used by the sub-systems 910 and 930 to physical memory addresses used by the memory controller 921 to access specific memory locations.

In this example, the SOC includes an I/O sub-system 950 for communication of data with external circuits. The I/O sub-system 950 may include various types of I/O devices or interfaces including for example, flash memory type I/O devices, higher performance I/O devices, lower performance interfaces, debugging I/O devices, and/or RAM I/O devices.

The I/O sub-system 950 may include one or more flash memory interfaces 960 illustrated as 960A and 960B. For example, one or more of flash memory interfaces 960 can be implemented as a Quad-Serial Peripheral Interface (QSPI) configured for 4-bit communication. One or more of flash memory interfaces 960 can be implemented as a parallel 8-bit NOR/SRAM type of interface. One or more of flash memory interfaces 960 can be implemented as a NAND interface configured for 8-bit and/or 16-bit communication.

It should be appreciated that the particular interfaces described are provided for purposes of illustration and not limitation. Other interfaces having different bit widths can be used.

The I/O sub-system 950 can include one or more interfaces 962 providing a higher level of performance than flash memory interfaces 960. Each of interfaces 962A-962C can be coupled to a DMA controller 964A-964C respectively. For example, one or more of interfaces 962 can be implemented as a Universal Serial Bus (USB) type of interface. One or more of interfaces 962 can be implemented as a gigabit Ethernet type of interface. One or more of interfaces 962 can be implemented as a Secure Digital (SD) type of interface. One or more of interfaces 962 can be implemented as a PCIe interface.

The I/O sub-system 950 may also include one or more interfaces 966 such as interfaces 966A-966D that provide a lower level of performance than interfaces 962. For example, one or more of interfaces 966 can be implemented as a General Purpose I/O (GPIO) type of interface. One or more of interfaces 966 can be implemented as a Universal Asynchronous Receiver/Transmitter (UART) type of interface. One or more of interfaces 966 can be implemented in the form of a Serial Peripheral Interface (SPI) bus type of interface. One or more of interfaces 966 can be implemented in the form of a Controller-Area-Network (CAN) type of interface and/or an I$^2$C type of interface. One or more of interfaces 966 also can be implemented in the form of a Triple Timer Counter (TTC) and/or a Watchdog Timer (WDT) type of interface.

The I/O sub-system 950 can include one or more debug interfaces 968 such as processor JTAG (PJTAG) interface 968A and a trace interface 968B. PJTAG interface 968A can provide an external debug interface for the SOC 902. Trace interface 968B can provide a port to receive debug, e.g., trace, information from the processing sub-system 910 or the programmable logic sub-system 930.

As shown, each of interfaces 960, 962, 966, and 968 can be coupled to a multiplexer 970. Multiplexer 970 provides a plurality of outputs that can be directly routed or coupled to external pins of the SOC 902, e.g., balls of the package within which the SOC 902 is disposed. For example, I/O pins of SOC 902 can be shared among interfaces 960, 962, 966, and 968. A user can configure multiplexer 970, via a configuration data stream to select which of interfaces 960-968 are to be used and, therefore, coupled to I/O pins of SOC 902 via multiplexer 970. The I/O sub-system 950, may also include a fabric multiplexer I/O (FMIO) interface (not shown) to connect interfaces 962-968 to programmable hardware resources of the programmable logic sub-system. Additionally or alternatively, the programmable logic sub-system 930 can be configured to implement one or more I/O circuits within programmable logic. In this example, the SOC 902 includes sub-system 940 having various circuits for power and/or safety management. For example, the sub-system 940 may include a power management unit 946 configured to monitor and maintain one or more voltage domains used to power the various sub-systems of the SOC 902. In some implementations, the power management unit 946 may disable power of individual sub-systems, when idle, to reduce power consumption, without disabling power to sub-systems in use.

The sub-system 940 may also include safety circuits to monitor the status of the sub-systems to ensure correct operation. For instance, the sub-system 940 may include one or more real-time processors 942 configured to monitor the status of the various sub-systems (e.g., as indicated in status registers 944). The real-time processors 942 may be configured to perform a number of tasks in response to detecting errors. For example, for some errors, the real-time processors 942 may generate an alert in response to detecting an error. As another example, the real-time processors 942 may reset a sub-system to attempt to restore the sub-system to correct operation. The sub-system 940 includes a switch network 948 that may be used to interconnect various sub-systems. For example, the switch network 948 may be configured to connect the various sub-systems 910, 930, and 940 to various interfaces of the I/O sub-system 950. In some applications, the switch network 948 may also be used to isolate the real-time processors 942 from the sub-systems that are to be monitored. Such isolation may be required by certain application standards (e.g., IEC-61508 SIL3 or ISO-26262 standards) to ensure that the real-time processors 942 are not affected by errors that occur in other sub-systems.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A method for sensing temperature and voltage using a ring oscillator, comprising:

measuring a first set of indications of frequency of the ring oscillator in a first mode, a second mode, and a third mode, respectively, wherein in each of the first, second and third modes, the ring oscillator oscillates with a different voltage-temperature response;

determining a first temperature estimate and a first voltage estimate of the ring oscillator based on the first set of indications of frequency;

measuring a second set of indications of frequency of the ring oscillator in the first, second, and third modes, respectively; and determining a second temperature estimate and a second voltage estimate of the ring oscillator as a function of the second set of indications of frequency, the first temperature estimate, and the first voltage estimate;

wherein the second temperature estimate and second voltage estimate are more accurate than the first temperature and first voltage.

2. The method of claim 1, further comprising:

measuring subsequent sets of indications of frequency of the ring oscillator in the first, second, and third modes, respectively; and for each of the subsequent sets of the indications of frequency, determining a subsequent temperature estimate and a subsequent voltage estimate of the ring oscillator as a function of the subsequent set of indications of frequency, a most recent one a temperature estimate determined for a previous set of the sets of indications of frequency, and a voltage estimate determined for the previous set, wherein the subsequent temperature estimate and subsequent voltage estimate are more accurate than the temperature estimate and voltage estimate determined for the previous set.

3. The method of claim 1, further comprising:
determining and storing a set of calibration values for the ring oscillator; and
wherein the temperature estimates and the voltage estimates are determined as a function of the set of calibration values.

4. The method of claim 3, wherein:
the determining of set of calibration values is performed prior to measuring the first indications of frequency; and
the determining of set of calibration values for the ring oscillator includes, for each of a plurality of calibration temperature and calibration voltage combinations:
operating the ring oscillator at the calibration temperature and calibration voltage;
measuring a respective indication of frequency of the ring oscillator in each of the first, second, and third modes; and
determining a ratio of the measured respective indication of frequency of the ring oscillator in the second mode to the measured indication of frequency of the ring oscillator in the third mode.

5. The method of claim 4, wherein the plurality of calibration temperature and calibration voltage combinations includes:
a first combination including a first calibration temperature and a first calibration voltage;
a second combination including the first calibration temperature and a second calibration voltage; and
a third combination including a second calibration temperature and the first calibration voltage.

6. The method of claim 5, wherein the determining of set of calibration values for the ring oscillator includes:
determining a slope ($M_{TR}$) of a change in the calibration temperature over a change in the ratio for the third combination relative to the first combination;
determining a slope ($M_{RV}$) of a change in the ratio over a change in the calibration voltage for the second combination relative to the first combination; and
determining a slope ($M_{VC}$) of a change in the calibration voltage to a change in the measured indication of frequency for the ring oscillator in the first mode for the second combination relative to the first combination.

7. The method of claim 6, wherein:
the set of calibration values includes $M_{TR}$, $M_{RV}$, $M_{VC}$, the first calibration temperature, the first calibration voltage, the ratio ($R_0$) determined for the first calibration temperature and the first calibration voltage, and the indication of frequency ($C_0$) determined for the first calibration temperature and the first calibration voltage;
the ring oscillator is included in an integrated circuit (IC); and
the method further comprising storing the set of calibration values in a non-volatile memory of the IC.

8. The method of claim 7, wherein the determining of set of calibration values for the ring oscillator is performed in response to the set of calibration values being absent from the non-volatile memory when the IC is powered on.

9. The method of claim 7, wherein:

$$T_1 = M_{TR}[R_1 - R_0] + T_0, \text{ and}$$

$T_1$ is the first temperature estimate determined in for the first set of indications of frequency, $T_0$ is the first calibration temperature, $R_0$ is the determined ratio of the measured indication of frequency of the ring oscillator in the second mode to the measured indication of frequency of the ring oscillator in the third mode for the first calibration voltage and first calibration temperature, $R_1$ is the ratio of the measured indication of frequency for the second mode in the first set of indications of frequency to the measured indication of frequency for the third mode in the first set of indications of frequency, and MTR is the determined slope of the change in the calibration temperature over the change in the ratio.

10. The method of claim 9, wherein:

$$V_1 = M_{VC}[C - C_0] + V_0, \text{ and}$$

$V_1$ is the first voltage estimate determined for the first set of indications of frequency, $C_0$ is the measured indication of frequency of the ring oscillator in the first mode for the first calibration voltage and first calibration temperature, $C_1$ is the measured indication of frequency for the first mode in the first set of indications of frequency, and $M_{VC}$ is the determined slope of the change in the calibration voltage to the change in the measured indication of frequency for the ring oscillator in the first mode.

11. The method of claim 10, wherein:

$$T_2 = M_{TR}[R_2 - M_{RV}(V_1 - V_0)) - R_0] + T_0, \text{ and}$$

$T_2$ is the second temperature estimate determined for the second set of indications of frequency, $R_2$ is the ratio of the measured indication of frequency of the ring oscillator in the second mode to the measured indication of frequency in the third mode for the second set of indications of frequency, and $M_{RV}$ is the determine slope of the change in the ratio over the change in the calibration voltage.

12. The method of claim 10, wherein:

$$V_2 = M_{VC}[C - (M_{CT} + M_{CT,V}(V_1 - b_{CT,V}))(T_1 - T_0) - C_0] + V_0,$$
and $V_2$ is the second voltage estimate determined for the second set of indications of frequency, $M_{CT}$ is a slope of a change in the indication of the frequency of the ring oscillator in the first mode over a change in temperature, $M_{CT,V}$ is a slope of a change in $M_{CT}$ over a change in voltage, and $b_{CT,V}$ is a constant voltage specified in the non-volatile memory.

13. The method of claim 1, wherein:
the ring oscillator has a circular signal path;
in the first mode the circular signal path includes a plurality of inverting circuits;
in the second mode the circular signal path includes greater routing delay between the inverting circuits in comparison to routing delay between the inverting circuits in the first mode; and
in the third mode the circular signal path includes transparent latches between the inverting circuits.

14. An integrated circuit, comprising:
a first ring oscillator configured to exhibit a different temperature-voltage response in each of a first mode, a second mode, and a third mode, wherein in each of the first, second and third modes, the first ring oscillator oscillates with a different voltage-temperature response; and
a logic circuit coupled to the first ring oscillator and configured to
measure a first set of indications of frequency of the first ring oscillator in each of the first, second, and third modes;
determine a first temperature estimate and a first voltage estimate of the first ring oscillator based on the first set of indications of frequency;

measure a second set of indications of frequency of the first ring oscillator in the first, second, and third modes, respectively; and determine a second temperature estimate and a second voltage estimate of the first ring oscillator as a function of the second set of indications of frequency, the first temperature estimate, and the first voltage estimate;

wherein the second temperature estimate and second voltage estimate are more accurate than the first temperature and first voltage.

15. The integrated circuit of claim 14, wherein the logic circuit is configured to mitigate effects of environmental variation by:

respectively aggregating, for each of the first, second, and third modes, the indications of frequency of the first ring oscillator operating in the mode from multiple ones of the sets of indications of frequency; and determining a temperature estimate and a voltage estimate as a function of the aggregated indications of frequency.

16. The integrated circuit of claim 14, further comprising:

a second ring oscillator configured to operate in the first mode; and wherein the logic circuit is configured to mitigate effects of environmental variation by, in measuring each set of the indications of frequency:

measuring three indications of frequency of the second ring oscillator operating in the first mode; and scaling the indications of frequency in the set based on differences between the three indications of frequency of the second ring oscillator.

17. The circuit of claim 14, further comprising:

a plurality of ring oscillators disposed in different locations of the integrated circuit, the plurality of ring oscillators including the first ring oscillator; and the logic circuit is configured to determine temperature estimates and voltage estimates at each of different locations using the plurality of ring oscillators.

18. The integrated circuit of claim 14, wherein:

the first ring oscillator includes a plurality of inverting circuits connected in circular signal path by a plurality of routing circuits;

in the second mode, the routing circuits are configured to exhibit greater routing delay between the inverting circuits in comparison to routing delay exhibited by the routing circuits in the first mode; and in the third mode, the circular signal path is configured to includes transparent latches between the inverting circuits.

19. The integrated circuit of claim 14, further comprising:

a programmable logic sub-system including a plurality of programmable hardware resources; and a configuration control circuit configured to, in response to a set of configuration data, program the plurality of programmable hardware resources to implement the first ring oscillator a set of circuits indicated in a set of configuration data for a hardware version of a user design.

20. The integrated circuit of claim 19, further comprising:

a processing sub-system configured to execute a software program specifying a software version of the user design; and wherein the logic circuit is further configured to power down only the programmable logic sub-system in response to the temperature or voltage estimates being indicative of an error in the processing sub-system.

* * * * *